(12) United States Patent
Shiode

(10) Patent No.: US 7,826,044 B2
(45) Date of Patent: Nov. 2, 2010

(54) MEASUREMENT METHOD AND APPARATUS, AND EXPOSURE APPARATUS

(75) Inventor: Yoshihiro Shiode, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 241 days.

(21) Appl. No.: 11/466,848

(22) Filed: Aug. 24, 2006

(65) Prior Publication Data

US 2007/0046929 A1 Mar. 1, 2007

(30) Foreign Application Priority Data

Aug. 29, 2005 (JP) ............................. 2005-246951

(51) Int. Cl.
*G01B 9/00* (2006.01)
(52) U.S. Cl. .................................... 356/124
(58) Field of Classification Search ................ 356/124, 356/399–401; 355/53, 55, 77; 430/5, 22, 430/30; 250/548
See application file for complete search history.

(56) References Cited

U.S. PATENT DOCUMENTS

| 5,828,455 | A | 10/1998 | Smith et al. | |
| 5,978,085 | A | 11/1999 | Smith et al. | |
| 7,598,006 | B1 * | 10/2009 | Smith et al. | 430/5 |
| 2002/0145717 | A1 * | 10/2002 | Baselmans et al. | 355/55 |
| 2003/0091913 | A1 * | 5/2003 | Shiode | 430/22 |
| 2004/0156041 | A1 * | 8/2004 | Shiode | 356/124.5 |

FOREIGN PATENT DOCUMENTS

JP 2004-146454 5/2004

\* cited by examiner

*Primary Examiner*—Tarifur Chowdury
*Assistant Examiner*—Michael LaPage
(74) *Attorney, Agent, or Firm*—Rossi, Kimms & McDowell LLP

(57) ABSTRACT

A measurement method for measuring an optical characteristic of a target optical system includes the steps of introducing a light from each of plural patterns that reduce diffracted lights other than a predetermined order, to a different position on a pupil plane of the target optical system, the introducing step including the step of scanning the light in a radial direction in the pupil plane of the target optical system, detecting a imaging position of the light introduced by the introducing step, on an image plane of the target optical system, and obtaining the optical characteristic of the target optical system based on a detection result of the detecting step.

3 Claims, 14 Drawing Sheets

MEASUREMENT METHOD AND APPARATUS, AND EXPOSURE APPARATUS

BACKGROUND OF THE INVENTION

The present invention relates generally to a measurement method, and more particularly to a measurement method for measuring an optical characteristic of an optical system. The present invention is suitable, for example, for a measurement of a wavefront aberration of a projection optical system that is used to project a reticle pattern onto a plate.

A conventional projection exposure apparatus manufactures a fine semiconductor device, such as a semiconductor memory and a logic circuit, using the photolithography technology. The projection exposure apparatus projects and transfers a circuit pattern of a reticle or mask onto a wafer etc. through a projection optical system.

The projection exposure apparatus should transfer a reticle pattern onto a wafer at a preset magnification or reduction ratio. It is important for this demand to use a projection optical system that has an excellent imaging characteristic with an extremely reduced aberration. In particular, the recent, rapidly promoting fine processing to semiconductor devices faces a problem of deteriorated pattern resolving power resulting from an aberration in manufacturing and designing the projection optical system. A fine pattern is sensitive to the aberration of the optical system. It is thus necessary to precisely measure an optical characteristic or aberration of the projection optical system.

Various measurement methods of the aberration of the projection optical system are currently proposed, and an actual evaluation and inspection of the projection optical system utilize measurements of various types of aberrations, such as a spherical aberration, a curvature of field, an astigmatism, a coma, and a wavefront aberration. Among these aberrations, the wavefront aberration is the very aberration. Once the wavefront aberration is approximated by the Zernike polynomial, other elemental aberrations can be calculated, such as a spherical aberration, a curvature of field, an astigmatism, and, a coma. In general, these aberrations are low frequency aberrations, and expressed by the fourth term to thirty-sixth term in the Zernike polynomial. A higher frequency aberration has never mattered little.

Along with the recent resolution enhanced technology, it is discovered that a high frequency component of the wavefront involves at least one of various problems near the resolution limit. A different aperture area around the reticle pattern typically leads to a critical dimension ("CD") difference of an exposed image. This phenomenon is caused by the light rounding a pattern, similar to the flare, when the aperture is large around the pattern. The flare is called a stray light and degrades imaging. The flare results from reflections on all members around a lens barrel and the lens barrel itself that holds a lens in a system in an exposure apparatus that includes the lens and a reticle. This phenomenon attributes only to the lens's wavefront. In general, the aberration is referred to as local flare. It is known that the local flare does not occur due to a low order aberration, but occurs due to a high order aberration or high frequency wavefront shape.

A method using a phase measurement interferometer ("PMI") is one local-flare quantifying method. This method analyzes PMI measured wavefront data through a fast Fourier transform ("FFT") frequency analysis, and expresses the intensity in a specific frequency range with a root mean square ("RMS") converted numerical values. The PMI can measure comparatively high order aberrations, and thus can measure the local flare at a high precision. Other known methods are a Kirk method and a method that actually transfers patterns having different aperture areas to a resist, and expresses the local flare with a pattern CD difference. The Kirk method exposes an aperture part having a predetermined area and a comparatively large BOX mark (with several micrometers) arranged in its center on plural shots while changing an exposure dose. The Kirk method represents the local flare with a ratio between an exposure dose at which the resist image of the BOX mark disappears and an exposure dose at which the resist image at the aperture part disappears.

The PMI local-flare measurement is viable to an adjustment and an inspection of a single lens, but is usually inapplicable after the lens is installed onto an exposure apparatus because the high frequency component's amplitude is very small. It is necessary to improve the measurement sensitivity and pixel resolution in the XY directions of the light receiving part for processing an interference pattern image so as to make the PMI measurement available in the exposure apparatus. Thus, the PMI measurement is a significant burden on the exposure apparatus.

The method of measuring the CD difference on an image transferred on a resist significantly depends upon the resist characteristic and the focusing and exposure dose conditions. Since the pattern's CD error is directly influential, the method needs a correction while taking a proximity effect into account, such as process influence, instead of a mere correction of the pattern CD difference, making the correction very complex. Thus, disadvantageously, this method cannot provide a sufficient precision. Also disadvantageously, the Kirk method degrades the precision due to unclear determinations of the pattern disappearance. These two methods have difficulties in correlating the local flare amount with the PMI measurement due to the above various error factors.

The most preferable measurement method would be to calculate the local flare in the exposure apparatus by measuring the high frequency wavefront shape, similar to the PMI, as disclosed, for example, in U.S. Pat. Nos. 5,828,455 and 5,978,085. This measurement method uses a special reticle that has a grating pattern arranged on a patterned surface, a pinhole below and apart from the grating pattern, and a convex lens above the grating pattern on a reticle glass surface opposing to the patterned surface. The illumination light has an angle of σ of 1 or greater due to the convex lens, and illuminates the grating pattern. The light that passes the grating pattern passes the pinhole below it. The light that can pass the pinhole is limited to the light having an angle formed by connecting each grating pattern position and the pinhole. In other words, the light emitted from each grating pattern has a different angle. The angularly different light reaches a different position on the pupil plane, and is incident or images on the wafer plane under influence of the wavefront aberration of the projection optical system. Each transferred image is subject to influence of a different wavefront aberration or phase. Since the light travels in a tangential direction of the wavefront, each transferred pattern shifts by a wavefront's inclination. The wavefront aberration can be calculated through various mathematical approaches by measuring a shift of the transferred pattern image from an ideal grating to obtain the wavefront's inclination in the pupil plane in the projection optical system.

A measurement method that utilizes an obliquely incident illumination is also conceivable. See, for example, Japanese Patent Application, Publication No. 2004-146454. This measurement method illuminates a reticle pattern with illumination lights having principal rays with different inclined angles or incident angles. The principal ray of the pattern illuminated by illumination lights having different angles or directions reach different positions on the pupil plane in the projection optical system. Similar to U.S. Pat. Nos. 5,828,455 and 5,978,085, the wavefront can be calculated by measuring a pattern's positional shift for each illumination angle and direction. These methods detect a wavefront's slope, and calculate a wavefront aberration. These methods have an advantage in a higher sensitivity to the high order aberration because they can more easily detect a slope even with a small phase difference as the frequency becomes high than the PMI that directly measures the phase.

Another proposed method uses a reticle that has a repetitive pattern having a phase difference of 90° and a pitch within a certain range, and forms an image through the two-beam interference, i.e., between the 0th order light and the 1st order diffracted light. Then, this method calculates a phase difference from a positional shift for each image pitch size, and directly calculates a wavefront.

None of the above three wavefront-aberration measurement method precisely measures a high order aberration to be recently measured. More specifically, each method forms an image of a reticle pattern, and calculates a wavefront shape from the pattern's positional shift. These methods uses one positional measuring mark with a predetermined size to measure a wavefront at a predetermined pupil coordinate position in the pupil plane. The predetermined size depends upon an NA of the projection optical system, but is about 1/20 as large as the pupil diameter when converted into the pupil plane at an NA of 0.85. This can sufficiently maintain a required precision for a low order aberration up to the 36th term in the Zernike polynomial, but needs a higher resolution when measuring such a high order aberration as that for the PMI. One positional shift measuring mark also needs a higher measuring sensitivity. The measuring sensitivity corresponds to a beam size when the beam is diffracted from one positional shift measuring mark and passes the pupil plane. Thus, a beam diameter should be made small.

BRIEF SUMMARY OF THE INVENTION

The present invention is directed to a measurement method that can precisely measure a high order aberration or high frequency component of the wavefront of a target optical system in such an apparatus as an exposure apparatus.

A measurement method according to one aspect of the present invention for measuring an optical characteristic of a target optical system includes the steps of introducing a light from each of plural patterns that reduce diffracted lights other than a predetermined order, to a different position on a pupil plane of the target optical system, the introducing step including the step of scanning the light in a radial direction in the pupil plane of the target optical system, detecting a imaging position of the light introduced by the introducing step, on an image plane of the target optical system, and obtaining the optical characteristic of the target optical system based on a detection result of the detecting step.

A measurement apparatus according to another aspect of the present invention for measuring an optical characteristic of a target optical system includes a patted member that has plural patterns that reduce diffracted lights other than a predetermined order, and a pinhole member that has plural pinholes that are arranged at a center position of one of the plural patterns and at a position that shift from a center position of another of the plural patterns.

An exposure apparatus for measuring an optical characteristic of a target optical system includes a patted member that has first and second patterns that reduce diffracted lights other than a predetermined order; and a first pinhole member that has a first pinhole arranged at a position corresponding to a center position of the first pattern, and a second pinhole member that has a second pinhole arranged at a position that shifts from a center position of the second pattern by a predetermined amount.

An exposure apparatus includes a projection optical system for projecting a pattern of a reticle onto a plate, a measurement apparatus for measuring an optical characteristic of the projection optical system, the measuring unit has a mode that executes the above measurement method, and an adjusting unit for adjusting the optical characteristic of the projection optical system based on a measurement result of the measuring unit.

An exposure apparatus includes a projection optical system for projecting a pattern of a reticle onto a plate, the above measurement apparatus for measuring an optical characteristic of the projection optical system, and an adjusting unit for adjusting the optical characteristic of the projection optical system based on a measurement result of the measuring unit.

Other objects and further features of the present invention will become readily apparent from the following description of the preferred embodiments with reference to the accompanying drawings.

DETAILED DESCRIPTION OF THE PREFERRED EMBODIMENTS

Figure 1:
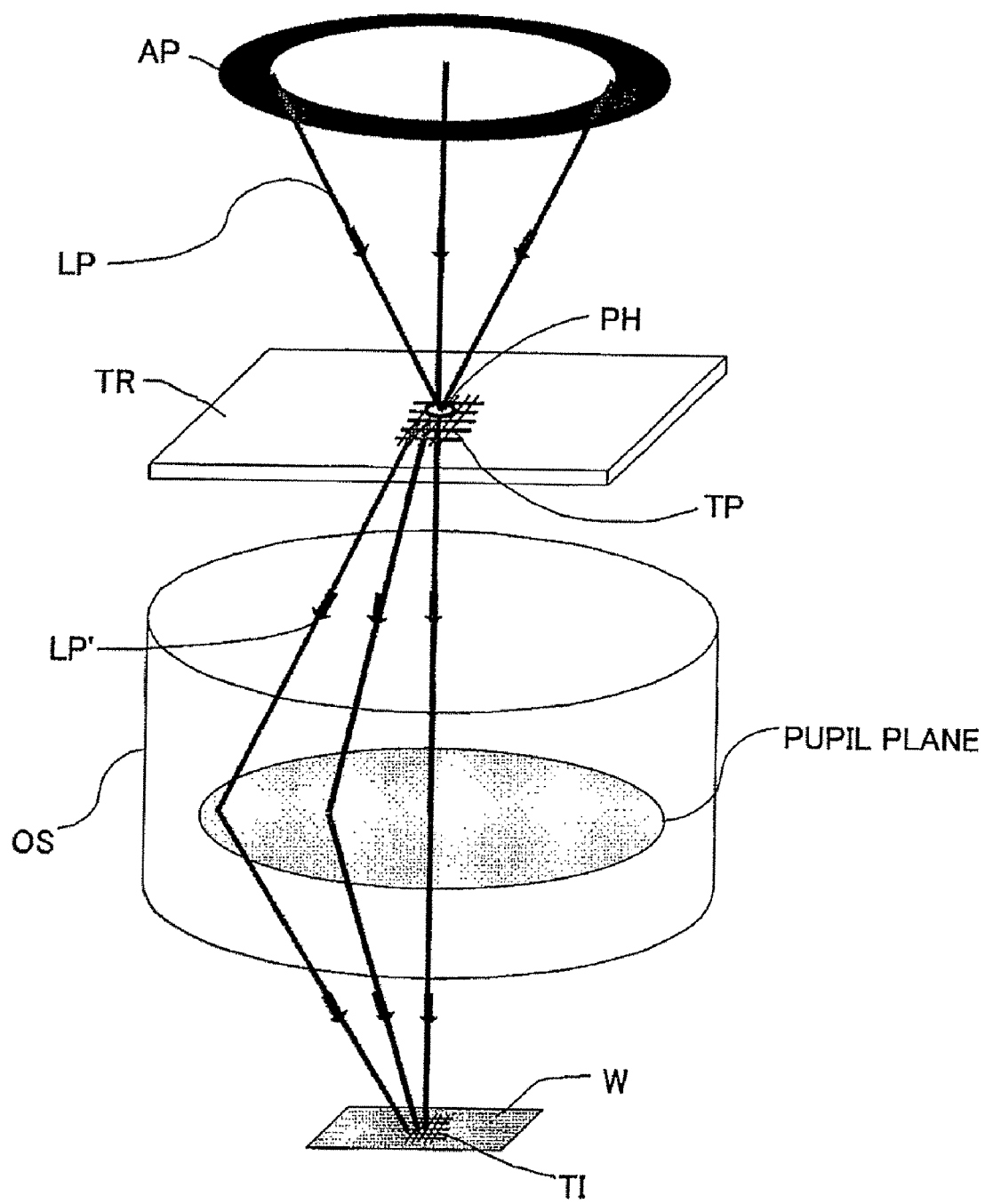
FIG. 1 is a view for explaining a principle of a measurement method according to one embodiment.

Referring now to the accompanying drawings, a description will be given of the preferred embodiment of the present invention. Similar elements are designated by the same reference numerals, and a duplicate description thereof will be omitted. FIG. 1 is a view for explaining a principle of a measurement method of this embodiment.

The measurement method of this embodiment enables to measure an optical characteristic, in particular, a high frequency component of the wavefront or high order aberration, of a target optical system OS. More specifically, the inventive measurement method uses a special reticle TR having a grating pattern TP that can form a image using only the 0th order (diffracted) light without substantially generating a 1st order diffracted light. The test reticle TR has a pinhole PH above a center of the grating pattern TP. The measurement method of this embodiment illuminates the test reticle TR using an obliquely incident illumination method disclosed in U.S. Patent Application, Publication No. 2004-156041 A1 that was assigned to the same assignee, disclosure of which is hereby incorporated by reference herein. Thereby, the grating pattern TP is illuminated by the lights from the pinhole PH in different directions, and the 0th order light from the grating pattern TP is imaged on a photosensitive substrate W via the target optical system OS. Therefore, the optical characteristic of the target optical system OS can be measured by detecting the imaging position.

This embodiment assumes that a projection optical system in an exposure apparatus is the target optical system OS. The exposure apparatus usually projects a reticle's circuit pattern onto a wafer through the projection optical system, and FIG. 1 shows that the exposure apparatus has the test reticle TR. In addition to the circuit pattern, the test reticle TR can use a reticle that has a pattern (i.e., a grating pattern TP) for measuring the optical characteristic, such as a wavefront aberration.

The test reticle TR shown in FIG. 1 is made of a glass substrate, and has plural grating patterns or marks TP formed on a patterned surface at the target optical system OS side, and a pinhole PH formed in a surface back to the patterned surface. The pinhole PH is made, for example, of a light shielding film. This embodiment forms the grating patterns TP and the pinhole PH on the front and back surfaces of the same glass substrate, although they may be formed in two different and adjacent glass plates.

The illumination light that passes an aperture stop AP in an illumination optical system has plural principal rays LP, and illuminates the pinhole PH with an NA (numerical aperture) corresponding to $\sigma \geq 1$. Each principal ray LP' that has passed the pinhole PH illuminates the grating patterns TP formed on the patterned surface of the test reticle TR. The 0th order (diffracted) light from each grating pattern TP images on the image plane of the photosensitive substrate W through the target optical system OS. A transferred pattern TI is formed when a photoelectric conversion element receives and photoelectrically converts an aerial image on the image plane or when the photosensitive substrate W is arranged on the image plane and each pattern image is transferred and developed. A position measuring unit (not shown) measures a position (or a positional shift from a reference position) of the aerial image or transferred pattern image TI on the image plane. The wavefront aberration of the projection optical system as the target optical system OS or the Zernike polynomial in this embodiment can be measured by operating the measurement result.

Figure 2A:
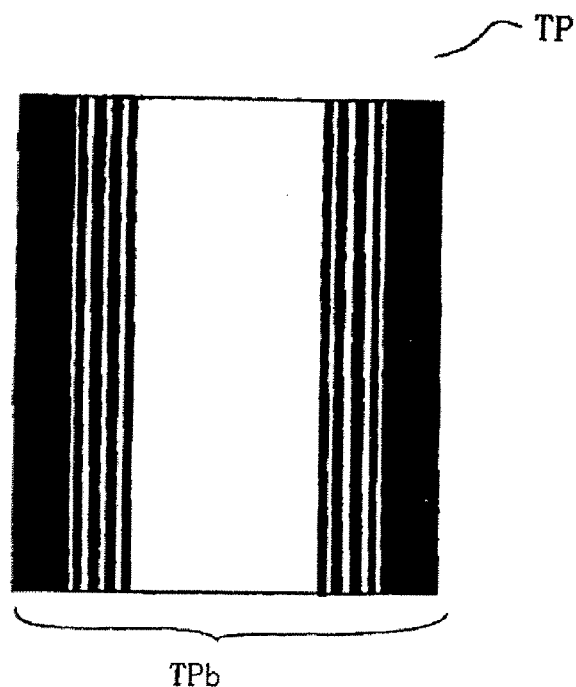
FIGS. 2A and 2B are schematic plane views showing a periodic pattern as one embodiment of a grating pattern shown in FIG. 1.
Figure 2B:
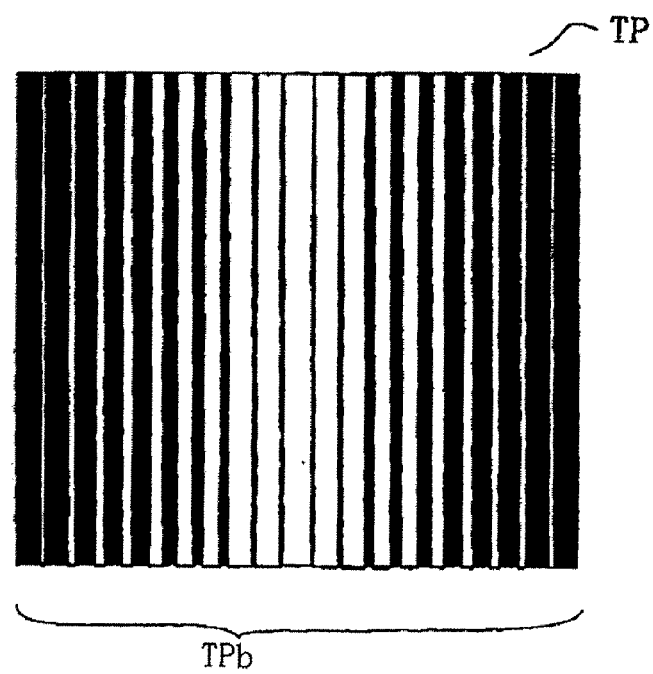

The grating pattern TP uses a pattern or diffraction grating mark shown in FIG. 2A or 2B. The grating pattern TP has a periodic pattern TPb having the same pitch or interval between lines or spaces, and each light transmitting space width decreases from the centerline or space to the outer pattern. The grating pattern TP has such a space width and pitch that only the 0th order (diffracted) light occurs without substantially generating a 1st order diffracted light by reducing a high order diffracted light. In addition, the line and space width and pitch are set such that the light intensity distribution of the pattern image of the grating pattern TP formed through the target optical system OS does not resolve between the internal lines and becomes a less distorted distribution. Thereby, the grating pattern TP can be regarded as one line at least on the image plane. Here, FIGS. 2A and 2B are schematic plane views showing the periodic pattern TPb as an embodiment of the grating pattern TP.

Figure 3:
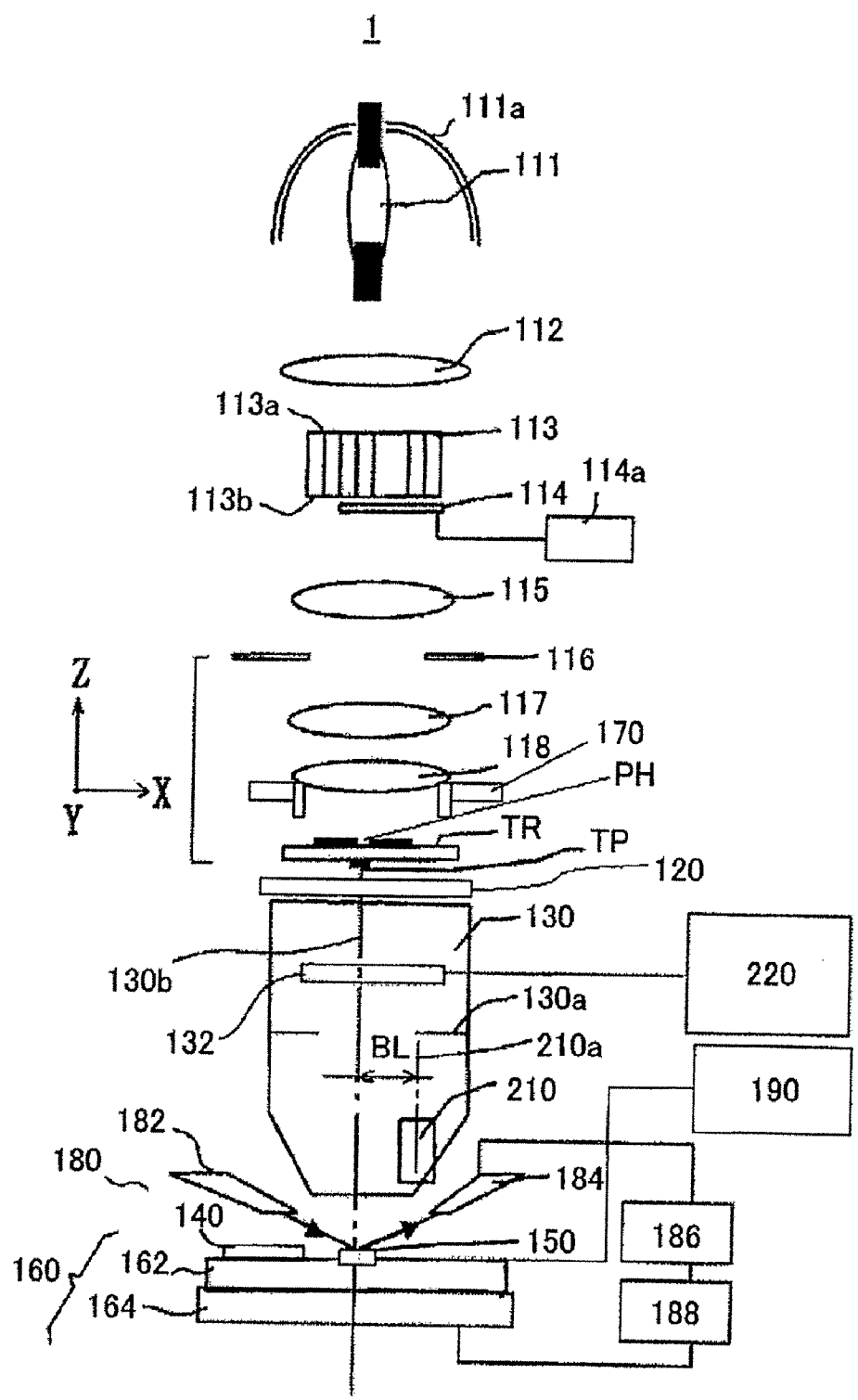
FIG. 3 is a schematic sectional view showing a structure of an exposure apparatus that applies a measurement method of this embodiment.

A description will now be given of an exposure apparatus 1 that applies the measurement method of this embodiment. Here, FIG. 3 is a schematic sectional view showing a structure of the exposure apparatus 1. The exposure apparatus 1 disposes the test reticle TR on a reticle stage 120 in FIG. 3, and disposes a reticle (not shown) having a circuit pattern on the reticle stage 120 in exposing a plate 130.

The exposure apparatus 1 is a projection exposure apparatus that exposes a circuit pattern of a reticle (not shown) onto a plate 140, for example, in a step-and-scan manner or step-and-repeat manner. This exposure apparatus is suitable for the lithography process for a resolution below a sub-micron or quarter-micron, and this embodiment discusses a step-and-scan exposure apparatus (also referred to as a "scanner") by way of example.

An elliptical mirror 111a condenses an exposure light emitted from an ultra-high pressure mercury lamp 111 as a light source section for exposure. The exposure light condensed by the elliptical mirror 111a is incident upon an incident plane 113a of a fly-eye lens 113 via an input lens 112.

A secondary light source is formed on a focal plane 113b after (or at the test reticle TR side of) the fly-eye lens 113. The exposure light emitted from the secondary light source uniformly illuminates the test reticle TR via an aperture stop 114, a first relay lens 115, a reticle blind 116, a second relay lens 117, and a main condenser lens 118. A changing unit can change an aperture diameter and shape of the aperture stop 114.

An aperture in the reticle blind 116 and the patterned surface of the test reticle TR has an optically conjugate relationship. Therefore, the reticle blind 116 sets an illumination area on the test reticle TR. The focal plane 113b of the fly-eye lens 113 is approximately conjugate with the pupil plane 130a in the projection optical system as the target optical system OS, and the secondary light source images on the pupil plane 130a.

The test reticle TR is placed on the reticle stage 120. The reticle stage 120 moves on the XY plane, and changes a position of the test reticle TR.

A light shielding film having the pinhole PH is formed on the top surface of the test reticle TR opposing to the patterned surface. When an illumination optical system or an alignment scope 170 that will be described later illuminates the pinhole PH in the test reticle TR, the light that passes the pinhole PH illuminates the grating pattern TP on the test reticle TR under condition of σ≧1. Each pattern of the illuminated test pattern TP or diffraction grating mark images on the plate 140 placed on a wafer stage 160 or a detection system 150 via the projection optical system 130.

The plate 140 is a wafer in this embodiment, but may cover a liquid crystal substrate and another substrate. A photoresist is applied to the plate 140.

Figure 4:
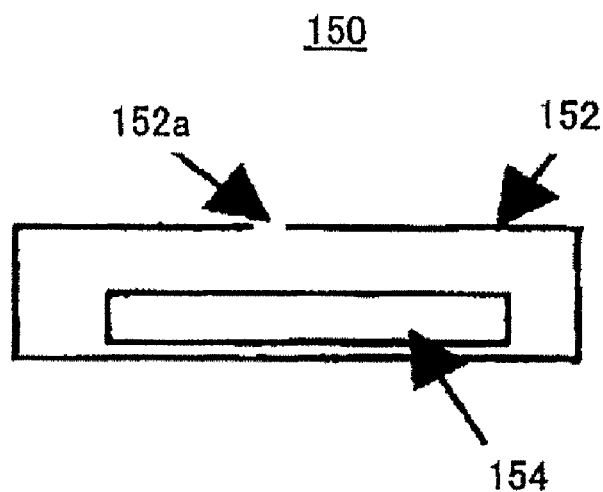
FIG. 4 is an enclosed sectional view showing a structure of a detecting system shown in FIG. 3.
Figure 5:
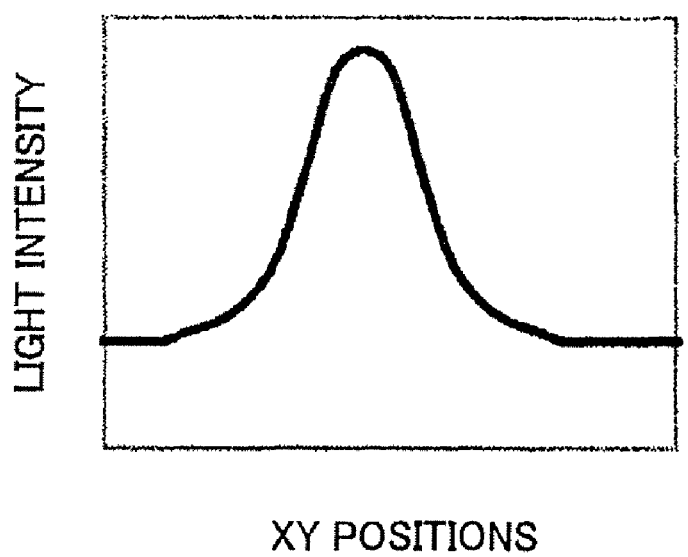
FIG. 5 is a graph showing one illustrative electric signal to be detected by a detecting system shown in FIG. 4.

The detection system 150 detects an aerial image of the grating pattern TP. FIG. 4 is an enlarged sectional view showing a structure of the detection system 150. The detection system 150 includes a plate 152 that has a slit 152a, and a light receiving part 154. The detection system 150 is arranged so that the top surface of the plate 152 is usually level with the image plane. The light receiving part 154 photoelectrically converts the light that has passed the slit 152a. When the wafer stage 160 moves the detection system 150 along the image plane, the image of the grating pattern TP is converted into an electric signal, for example, shown in FIG. 5 so as to detect a position of the image of the grating pattern TP. FIG. 5 is a graph showing one illustrative electric signal detected by the detection system 150.

The wafer stage 160 in this embodiment includes an XY stage 162 and a Z stage 164. The XY stage 162 positions the plate 140 and the detection system 150 at an arbitrary position on the XY plane perpendicular to the optical axis 130b of the projection optical system 130. The Z stage 164 sets a position of the plate 140 or the detection system 150 in a direction parallel to the optical axis 130b of the projection optical system 130.

The alignment scope 170 detects a mark on the test reticle TR and a reticle reference mark (not shown) provided in a body of the exposure apparatus 1. The alignment scope 170 detects a positional shift between the reticle reference mark and the test reticle TR. The test reticle TR can be aligned with the projection optical system 130 when the reticle stage 120 is driven based on the detection result (regarding the positional shift).

The alignment scope 170 is movable on any arbitrary XY position on the test reticle TR. Thereby, the exposure light can illuminate an arbitrary grating or measuring pattern TP on the test reticle TR in measuring the wavefront aberration. The illumination optical system can illuminate an arbitrary grating pattern TP on the test reticle TR through an aperture of the projection type reticle blind 116.

An autofocus system 180 detects a position in the optical-axis direction, of the plate 140 or the plate 152 of the detection system 150. The autofocus system 180 in this embodiment includes a light emitting system 182, and a light receiving system 184. The light emitting system 182 projects an image of a slit shaped detection pattern onto the plate 152 of the detection system 150, oblique to the optical axis 130b of the projection optical system 130. The light receiving system 184 receives the light reflected from the top surface of the plate 140 or the surface of the plate 152, reforms an image of the detection pattern, and detects the position.

Regarding the height direction, when the position of the plate 140 or the plate 152 of the detection system 150 changes a position relative to the image plane of the projection optical system 130, an image position of the detection pattern that is reformed on the light receiving system 184 changes. Therefore, a height change of the plate 140 or the detection system 150 can be detected when the image position of the detection patter is detected.

The light receiving system 184 includes a photoelectric detector 186 and a control system 188. The photoelectric detector 186 generates a focus signal that changes according to the reformed image position of the detection pattern. The control system 188 drives the Z stage 164 of the wafer stage 160 so that the focus signal maintains a predetermined level. Thereby, the top surface of the plate 140 and the surface of the plate 152 of the detection system 150 can be made level with the image plane of the projection optical system 130. The focus signal approximately linearly changes with a positional change in the height direction of the plate 152 of the detection system 150 within a predetermined range in the optical-axis direction. Therefore, use of the autofocus system 180 and the wafer stage 160 enables the top surface of the plate 140 and the surface of the plate 152 of the detection system 150 to be set at a position different from the image plane of the projection optical system 130.

A wafer alignment system 210 is an off-axis alignment system, and detects an alignment mark formed near each shot of the plate 140 with a previously calculated interval or a so-called baseline amount BL between an optical axis 210a of the wafer alignment system 210 and the optical system 130a of the optical system 130a. This configuration provides, based on several alignment mark positions measured by the wafer alignment system 210, a precise alignment between each shot area on the plate 140 and the circuit pattern image.

Figure 6:
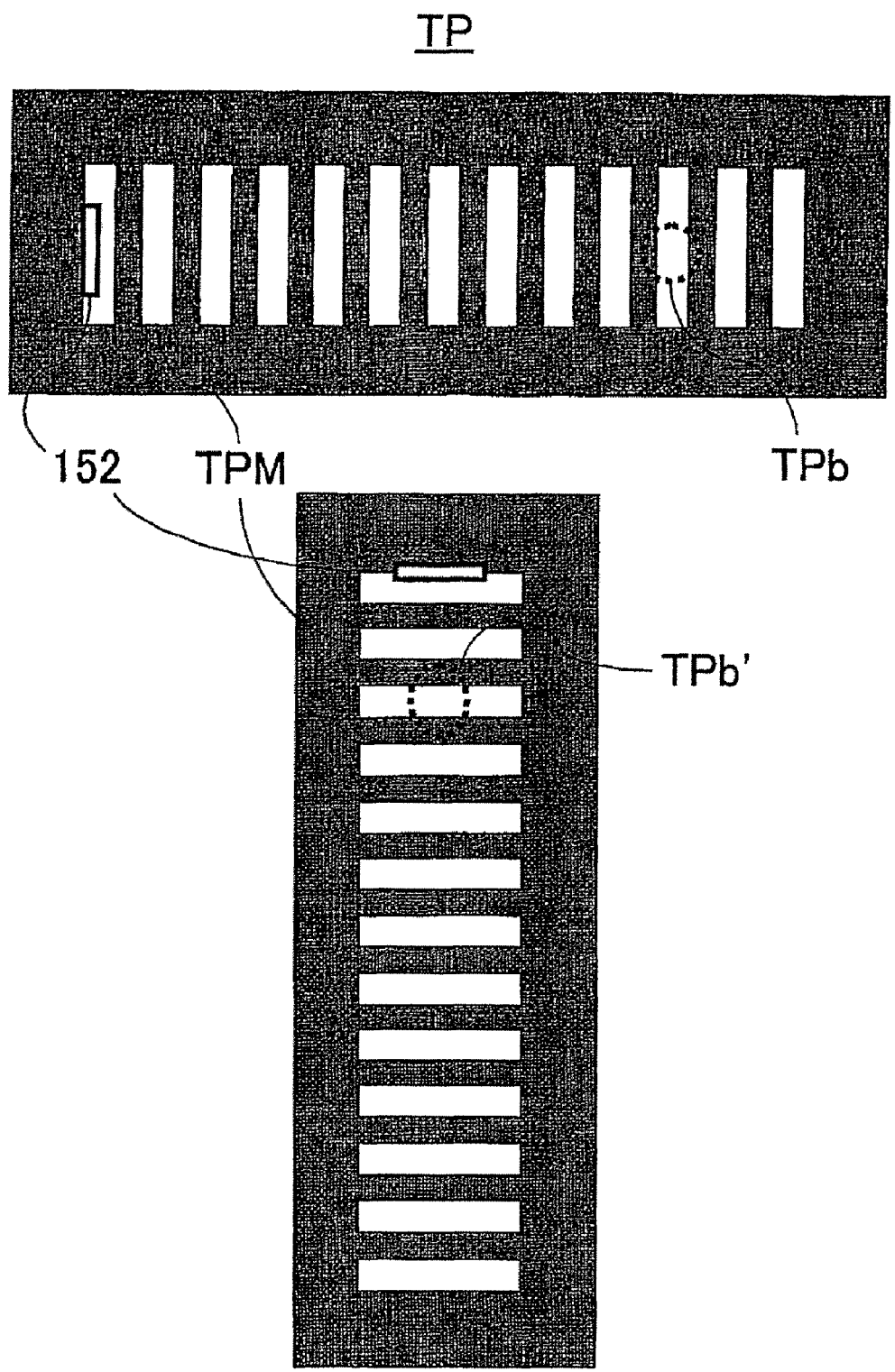
FIG. 6 is a schematic plane view showing details of a grating pattern of a test reticle shown in FIG. 3.

FIG. 6 is a schematic plane view showing a detail of the grating pattern TP in the test reticle TR. In FIG. 6, TPM denotes a mark of the grating pattern TP to be used. The mark TPM has plural periodic patterns TPb shown in FIG. 2A or 2B that are shaped so as to substantially eliminate no high order diffracted lights and arranged in the X direction, in a range that can be considered one image height of the projection optical system 130. The mark TPM may have plural periodic patterns TPb' that are formed by rotating the periodic patterns TPb by 90°, and are arranged in the Y direction. This embodiment scans the pupil plane 130a in the projection optical system 130 with a light from a periodic pattern in a radial direction, and extracts a high order frequency component. The high order frequency component can also be measured in a direction other than 0° and 90° by rotating the mark TPM by a predetermined amount. This embodiment assumes that the mark TPM has the periodic pattern TPb only in the X direction.

Figure 7:
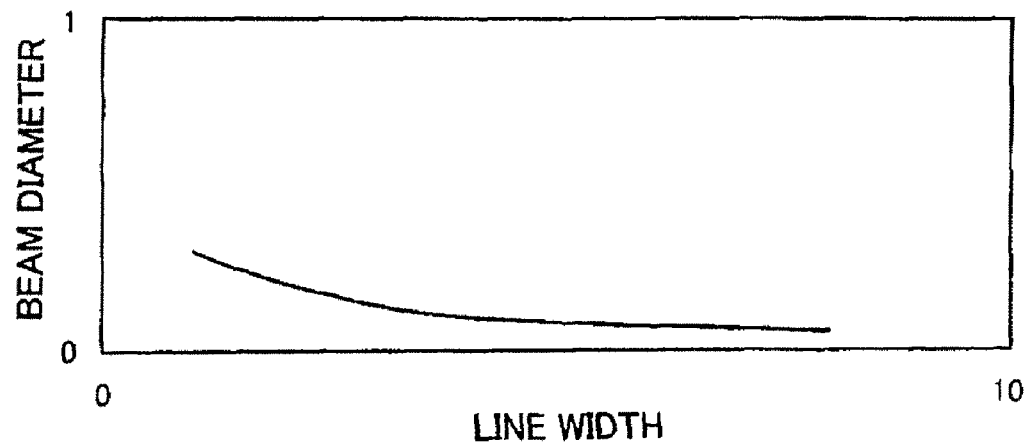
FIG. 7 is a graph showing a relationship between a line width of a mark shown in FIG. 6 and a beam diameter that passes a pupil plane.

Referring to FIG. 6, each line of the grating in the mark TPM is designed to have the same CD of about 4 μm. Although the line width of the mark TPM has no limitation, it is known from an optical simulation that the line width correlates with the spectrum bandwidth on the pupil plane 130a or the beam diameter that passes the pupil plane 130a. FIG. 7 is a graph showing a relationship between the line width of the mark TPM and the beam diameter that passes the pupil plane 130a. In FIG. 7, an ordinate axis denotes a beam diameter, and an abscissa axis denotes a line width. The line width denotes a length of the periodic pattern TPb shown in FIGS. 2A and 2B. As the line width increases, the beam diameter in the X direction which passes the pupil plane 130a in the projection optical system 130 can be made smaller. By reducing the beam diameter in the X direction, a higher frequency wavefront can be measured in the X direction. The mark TPM in the longitudinal direction may have a size that can be considered one image height, and be properly set on the basis of an average length to be measured by the detection side. This embodiment sets it to 20 μm.

Figure 8:
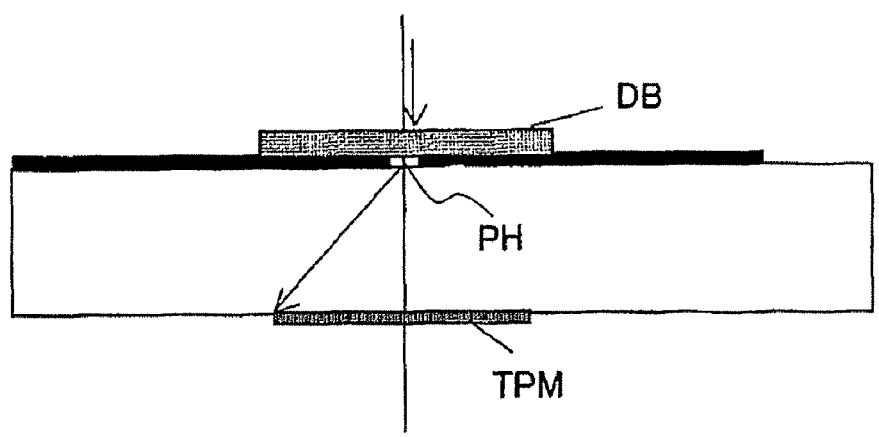
FIG. 8 is a schematic sectional view showing a structure of variation of a test reticle shown in FIG. 1.

The test reticle TR of this embodiment has the marks TPM shown in FIG. 6 at plural positions on the bottom surface of the glass substrate, which correspond to plural image heights of the projection optical system 130. The light shielding film having pinholes PH at positions corresponding to centers of the respective marks TPM is formed on the top surface of the glass substrate. The illumination optical system or the alignment scope 170 is used to illuminate the mark TPM. If the illumination light's σ is below 1.0, a test reticle TRA with a scattering plate or a diffuser DB on the pinholes PH as shown in FIG. 8 is used to illuminate the marks TPM under condition of σ≧1.0. The diffuser DB creates the condition of σ≧1.0 by diffusing the illumination light, thereby illuminating, from different directions, all the marks TPM necessary to measure the optical characteristic of the projection optical system 130. Here, FIG. 8 is a schematic sectional view showing a structure of the test reticle TRA as a variation of the test reticle TR.

Figure 9A:
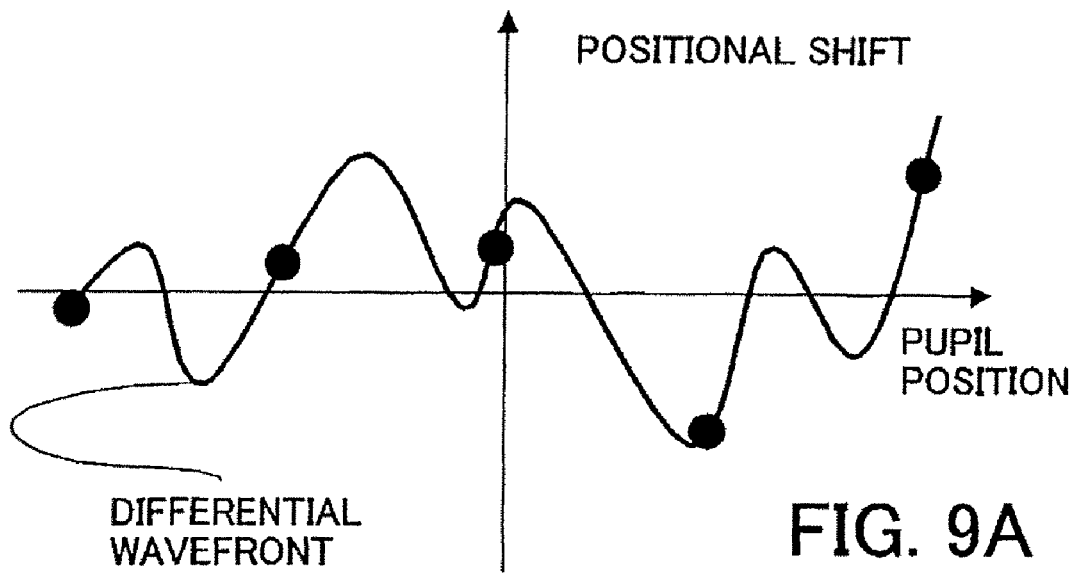
FIGS. 9A and 9B show one illustrative differential wavefront in the pupil plane in a projection optical system.

For instance, assume that the test reticle TRA shown in FIG. 8 is illuminated by the exposure light so as to form an image of each periodic pattern TPb of the mark TPM corresponding to one image height on the detection system 150 on the wafer stage 160 via the projection optical system 130. In that case, the wafer stage 160 is driven in the X direction so that the slit 152a in the plate 152 is scanned along the image plane relative to the pattern image, and the light intensity distribution of the pattern image is detected as an output change of the light receiving part 154. A calculator 190 calculates a center position of the periodic pattern TPb based on the light intensity distribution detected by the light receiving part 154. The slit 152a has a length and width smaller than the pitch of the aerial image of the grid of the grating pattern TP, as shown in FIG. 6, and the width of the slit 152a is set to such a width that the light from an image other than an image of the periodic pattern TPb to be measured is not incident upon the slit 152a. The image-height position is fixed to the center position of the mark TPM. The calculator 190 obtains a differential wavefront that passes the center in the pupil plane 130a, is scanned in the X direction, and sampled, from the center position of each pattern image and a coordinate of the light that forms an image of each pattern in the pupil plane 130a in the projection optical system 130. FIG. 9 shows one illustrative differential wavefront. In FIG. 9, an ordinate axis denotes a positional shift of the pattern image, and the abscissa axis denotes a position of the pupil plane 130a in the projection optical system 130.

Figure 10:
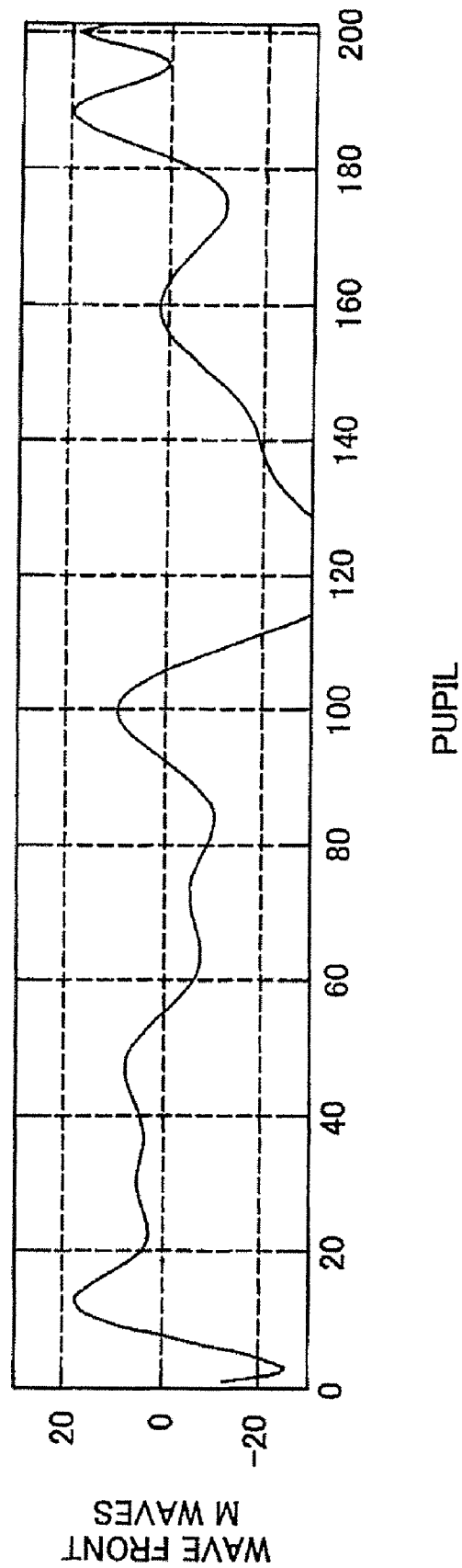
FIG. 10 is a graph showing wavefront data in the projection optical system that utilizes a simulation of this embodiment.
Figures 11A, 11B, 11C, 11D:
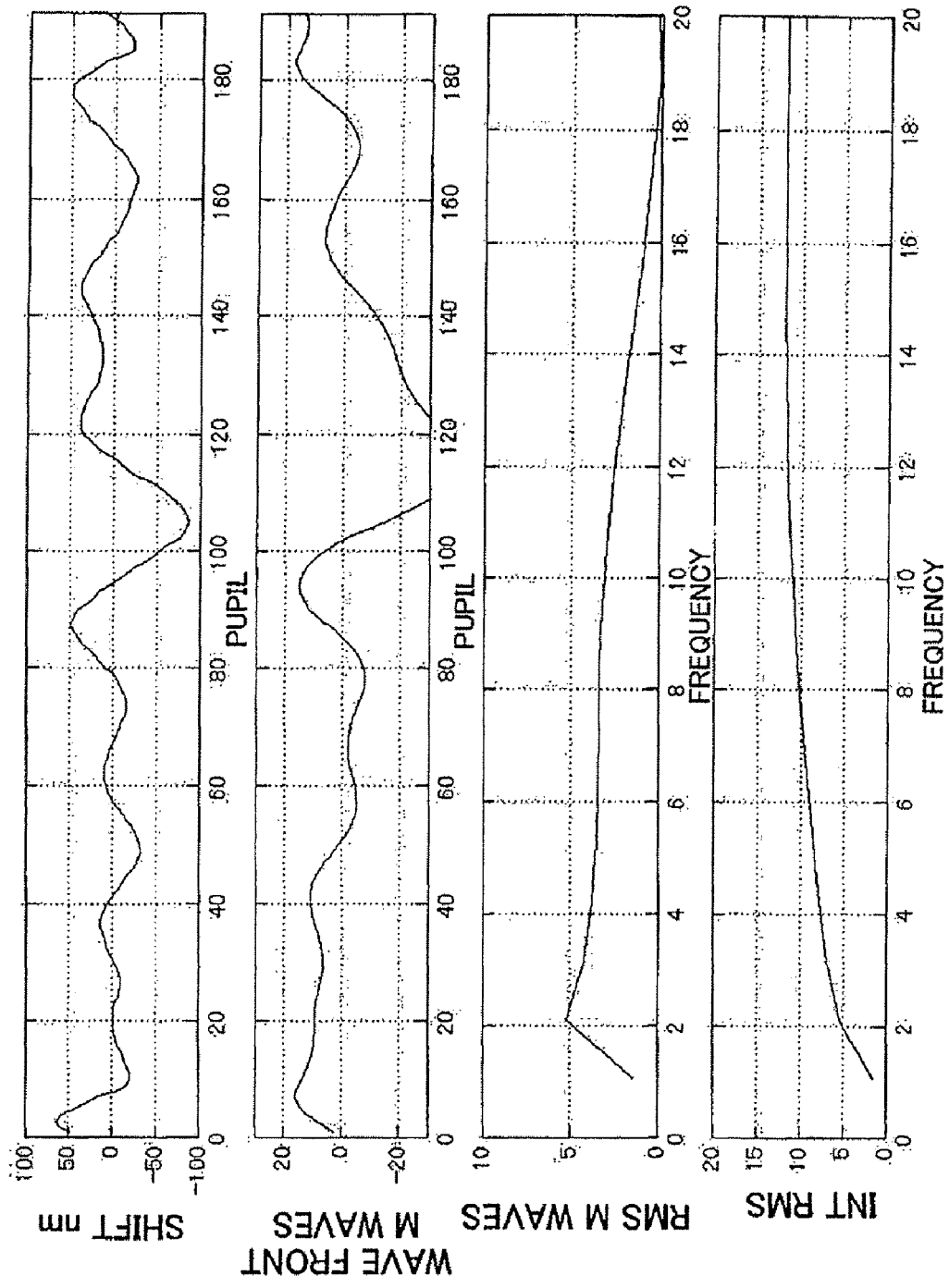
FIGS. 11A to 11D are graphs showing analytical results of a differential wavefront shown in FIG. 10.

The subsequent FFT analysis of the differential wavefront shown in FIG. 9 can calculate the RMS local flare of a higher order aberration component of the projection optical system than the thirty-sixth term in the Zernike polynomial. The high order aberration component in the projection optical system 130 corresponds to a frequency wavefront between 8.8 Hz and 136.6 Hz. The local flare can be calculated through the FFT analysis after the differential wavefront shown in FIG. 9 is integrated once to reproduce the wavefront. For example, FIGS. 11A to 11D show an analytical results of wavefront data of the projection optical system 130 shown in FIG. 10. FIG. 11A shows a differential wavefront obtained by measuring a positional shift in the X direction of the wavefront of the projection optical system 130. FIG. 11B shows a wavefront obtained by integrating the differential wavefront shown in FIG. 11A. FIG. 11C shows an FFT analysis result of a wavefront or an RMS value every frequency. FIG. 11D shows a cumulative result of the RMS values for each frequency shown in FIG. 11C. It is understood from FIG. 11D that the RMS converges upon a certain value. However, the actual local flare component is represented by setting the wavefront aberration having thirty-six terms in the Zernike polynomial, for example, as the RMS up to a frequency of 5 Hz and by subtracting an added RMS value of a frequency between 0 and 5 Hz from the convergent value.

Figure 9B:
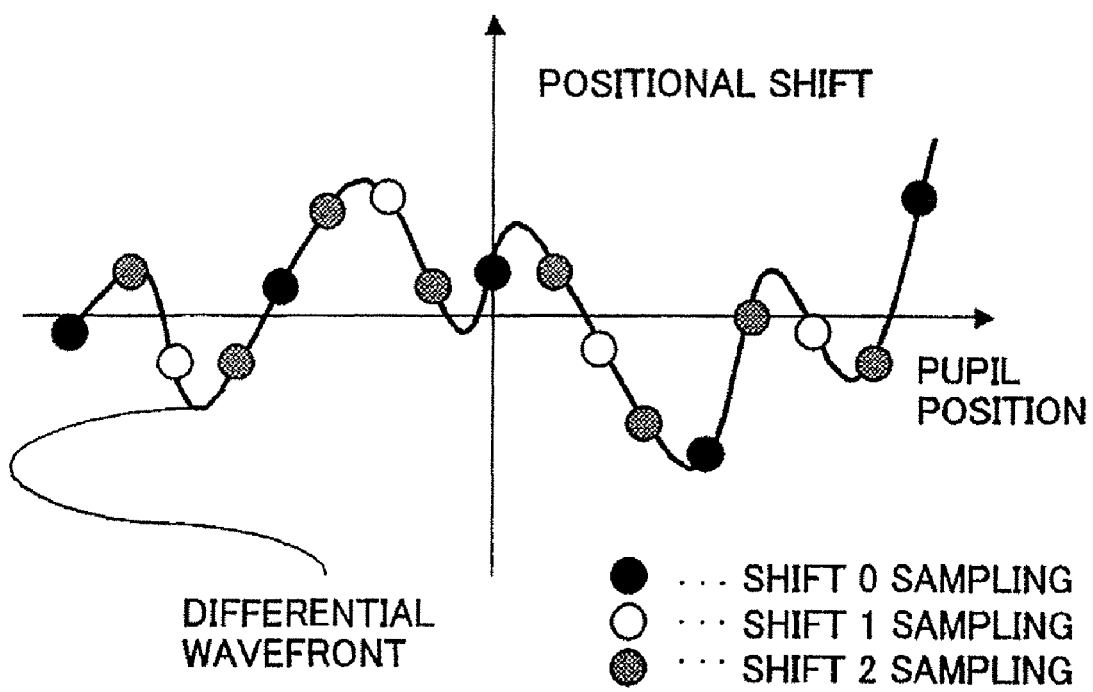
Figure 12:
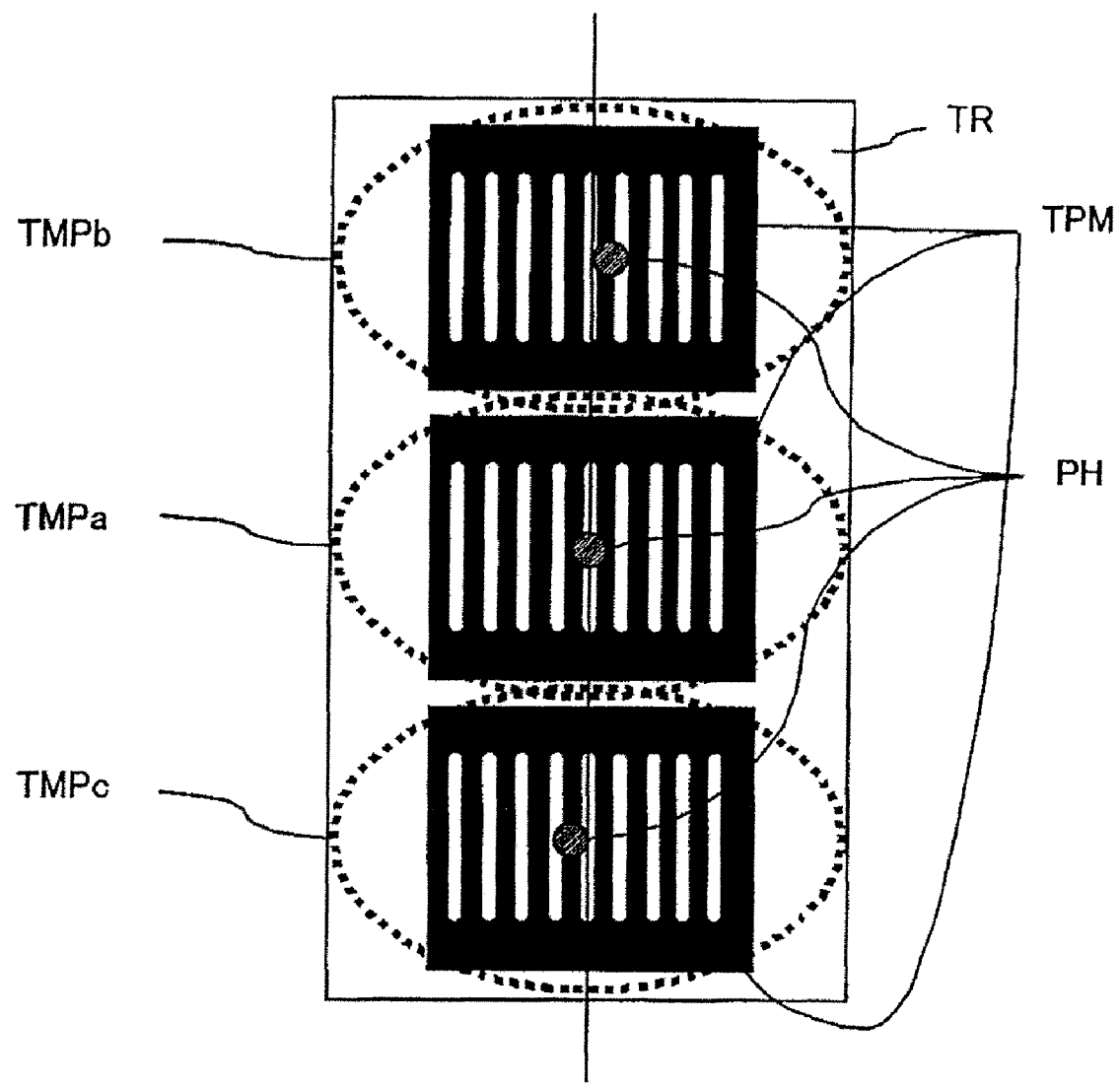
FIG. 12 is a schematic plane view showing a test reticle in which a pinhole center shifts from a mark's center position by a predetermined amount.

One conceivable method of precisely measuring the high frequency component is to increase the sampling number on the pupil plane 130a in the projection optical system 130. Accordingly, as shown in FIG. 12, a center of the pinhole PH is intentionally shifted from the center position of the mark TPM by a certain amount. The test reticle TR shown in FIG. 12 has marks TMPa with no shifts, and marks TMPb and TMPc with shifts. For the marks TMPa with no shifts and the marks TMPb and TMPc with shifts, a position of the light that passes the pupil plane 130a is proportional to the shift amount. As a consequence, the spectra of the marks TMPb and TMPc wholly shift relative to the spectrum of the marks TMPa. With the shift amount between the center of the pinhole PH and the center position of the mark TPM, the sampling number increases at proper intervals as shown in FIG. 9B. The similar FFT analysis can measure, at a higher sensitivity, a higher order aberration component of the wavefront in the projection optical system 130 than the thirty-sixth term in the Zernike polynomial. Here, FIG. 12 is a schematic plane view showing the test reticle TR in which the centers of the pinhole PH shifts from the center positions of the mark TPM by a certain amount.

This embodiment measures the RMS (local flare) through the one-dimensional FFT analysis in the X or Y direction or an arbitrary angular direction in the pupil plane 130a in the projection optical system 130. The precision improves when the above positional shift is measured over the entire area in the pupil plane 130a, and the RMS (local flare) is measured from the two-dimensional FFT analysis. In that case, the length of 20 μm of the mark TPM is too short, and should be made longer to cover the entire area in the pupil plane 130a. In order to locally measure a positional shift at different position in the longitudinal direction of the mark TPM, the length of the slit 152a should be adjusted according to measurement intervals.

The above embodiment detects an image position of the grating pattern TP through the detection system 150 (photoelectric converter element) fixed onto the wafer stage 160. This embodiment uses a position measuring unit (not shown), and detects a transferred image position of the grating pattern TP after the image of the grating pattern TP is transferred onto the plate (photosensitive substrate) 140 and then developed.

Figure 13:
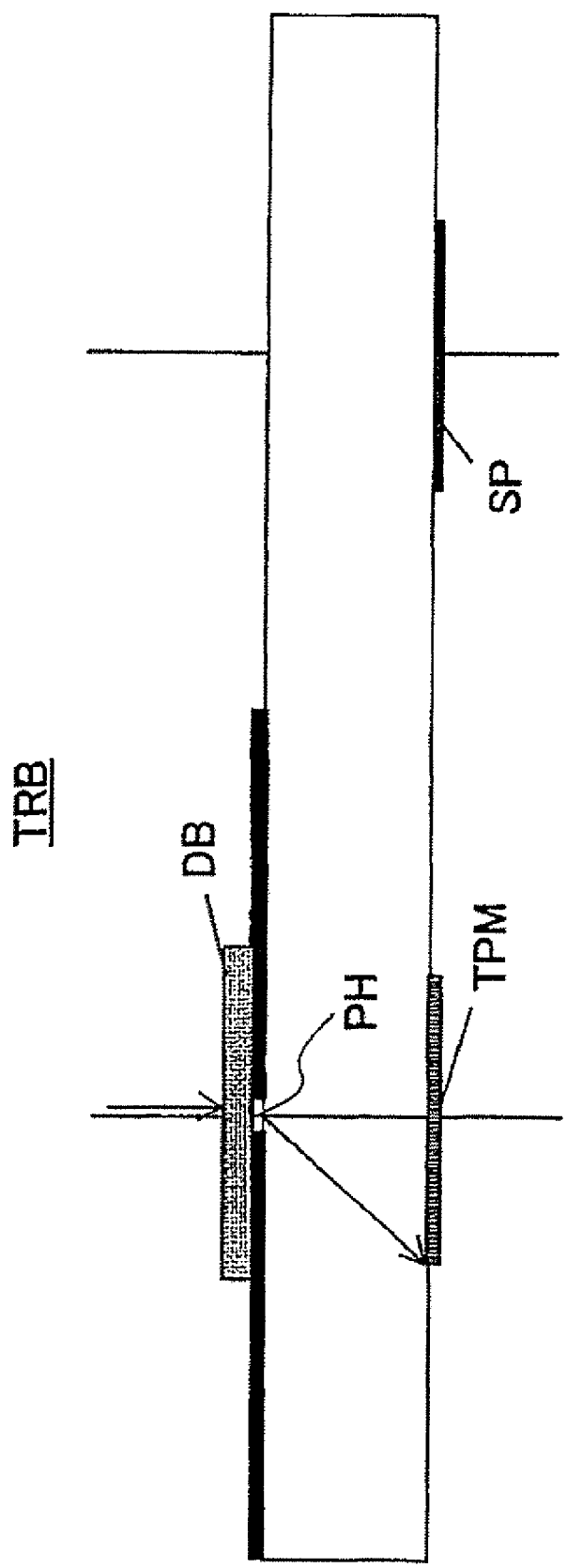
FIG. 13 is a schematic sectional view showing a structure of the test reticle.

This embodiment uses a test reticle TRB having a reference (or test) pattern SP, as shown in FIG. 13, in addition to the mark TPM (grating pattern TP) shown in FIG. 6. Referring to FIG. 13, the test reticle TRB has a light shielding film having a pinhole PH on the top surface, and the mark TPM and reference pattern SP on the bottom surface of the glass substrate. Here, FIG. 13 is a schematic sectional view showing a structure of the test reticle TRB.

Figure 14:
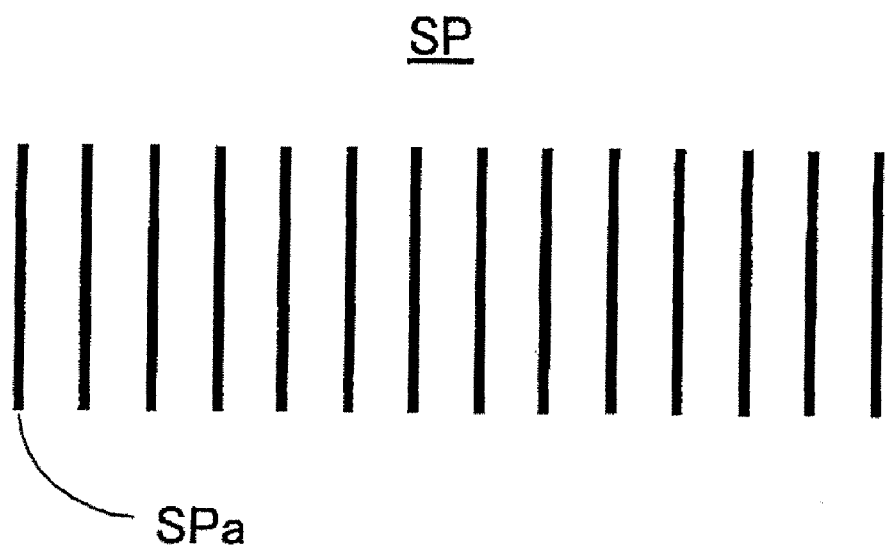
FIG. 14 is a schematic plane view showing one illustrative reference pattern to be added to a grating pattern shown in FIG. 6.

The reference pattern SP has line marks SPa as shown in FIG. 14. The line marks SPa are plural reference marks arranged in a row to measure a relative positional shift of the periodic pattern TPb of the grating pattern TP. Referring to FIG. 13, no element restricts the light above the reference pattern SP, unlike the light shielding film having the pinhole PH, and thus the light from the illumination optical system or the alignment scope 170 uniformly illuminates the reference pattern SP. Therefore, the line marks SPa are influenced by the same wavefront, and become reference marks with no relative positional shifts. Here, FIG. 14 is a schematic plane view of one illustrative reference pattern SP.

Figure 15:
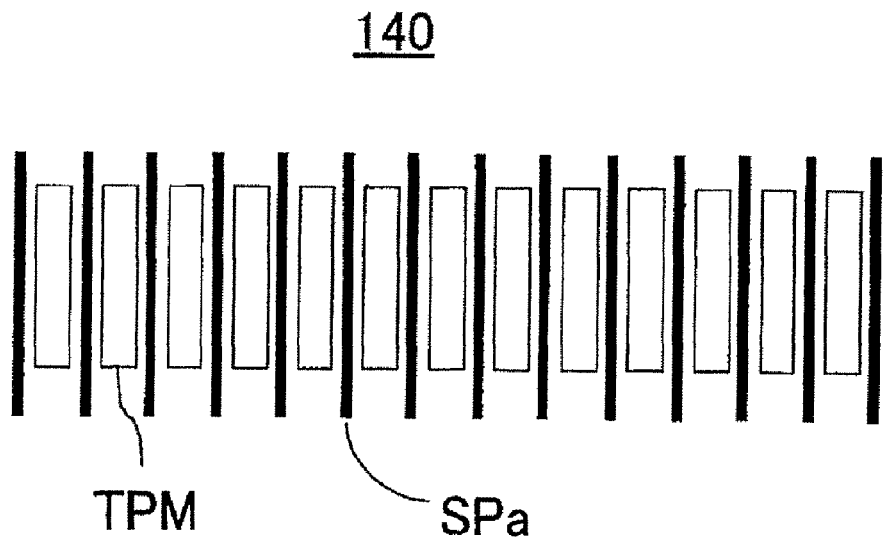
FIG. 15 is a schematic plane view of a plate onto which a grating pattern overlaps a reference pattern.

Initially, the reference pattern SP and the mark TPM as the test pattern are illuminated under the illumination condition optimal to the mark TPM (grating pattern TP), and each mark image is exposed onto the plate 140. Next, the reticle stage 120 or the wafer stage 160 is driven so that the currently exposed pair of the mark TPM and the reference pattern SP overlaps the subsequently exposed pair of the mark TPM and the reference pattern SP. The reference pattern SP and the mark TPM are exposed under the normal illumination condition. After the plate 140 is developed, a relative positional shift amount between a transferred pattern image of the mark TPM (periodic pattern TPa) and the reference pattern SP (line mark SPa) is measured as shown in FIG. 15. FIG. 15 is a schematic plane view of the plate 140 on which the marks TPM (grating pattern TP) and the reference patterns SP overlap and are transferred.

The above FFT analysis to the measured relative positional shift amount (or the center position of the transferred image of the periodic pattern TPa) calculates the RMS (local flare) of a higher order aberration component of the wavelength in the projection optical system 130 than the thirty-sixth term in the Zernike polynomial. This embodiment can also measure the optical characteristic of the projection optical system 130 over the entire area of the pupil plane 130a by changing longitudinal positions in the reference pattern SP and by locally measuring the positional shift between the reference pattern SP and the mark TPM. The RMS (local flare) can be measured more precisely through the two-dimensional FFT analysis.

As described above, the measurement method of this embodiment can precisely measure the optical characteristic or wavefront aberration of the projection optical system 130 in the exposure apparatus 1, in particular, a high order wavefront aberration. By feeding back the measuring result of the high order wavefront to an aberration adjusting mechanism in the exposure apparatus 1, various device patterns can be fine-adjusted based on the previously stored characteristic data of these device patterns. For example, exposure control corrects a CD change. An optical proximity effect ("OPE") characteristic variation is adjusted by driving a lens in the illumination optical system to correct an effective light source shape, by driving a lens in the projection optical system or by driving a lens aperture. In addition, defocus and longitudinal driving of a reticle also provide this adjustment. The aberration of the projection optical system 130 can be adjusted by changing a pressure in a space between lenses in the projection optical system 130. This aberration adjusting mechanism is implemented by a lens driver 220 that drives a lens 132 in the projection optical system 130 as shown in FIG. 3. The aberration adjusting mechanism may also include a driver that drives a lens in the illumination optical system, and a laser wavelength tuner that tunes a wavelength of the light source section, such as the ultra-high mercury lamp 111.

In exposure, the light emitted from an ultra-high pressure mercury lamp 111, for instance, Koehler-illuminates a reticle (not shown) through an illumination optical system that includes the input lens 112 to the main condenser lens 118. The light that passes the reticle and reflects the circuit pattern forms an image on the plate 140 due to an operation of the projection optical system 130. The projection optical system 130 used by the exposure apparatus 1 is optimized based on a precise measurement result of a high order wavefront aberration. Thus, the exposure apparatus 1 can provide such a device with a good throughput and economical efficiency as a semiconductor device, an LCD device, an image pickup device (e.g., a CCD) and a thin-film magnetic head.

Figure 16:
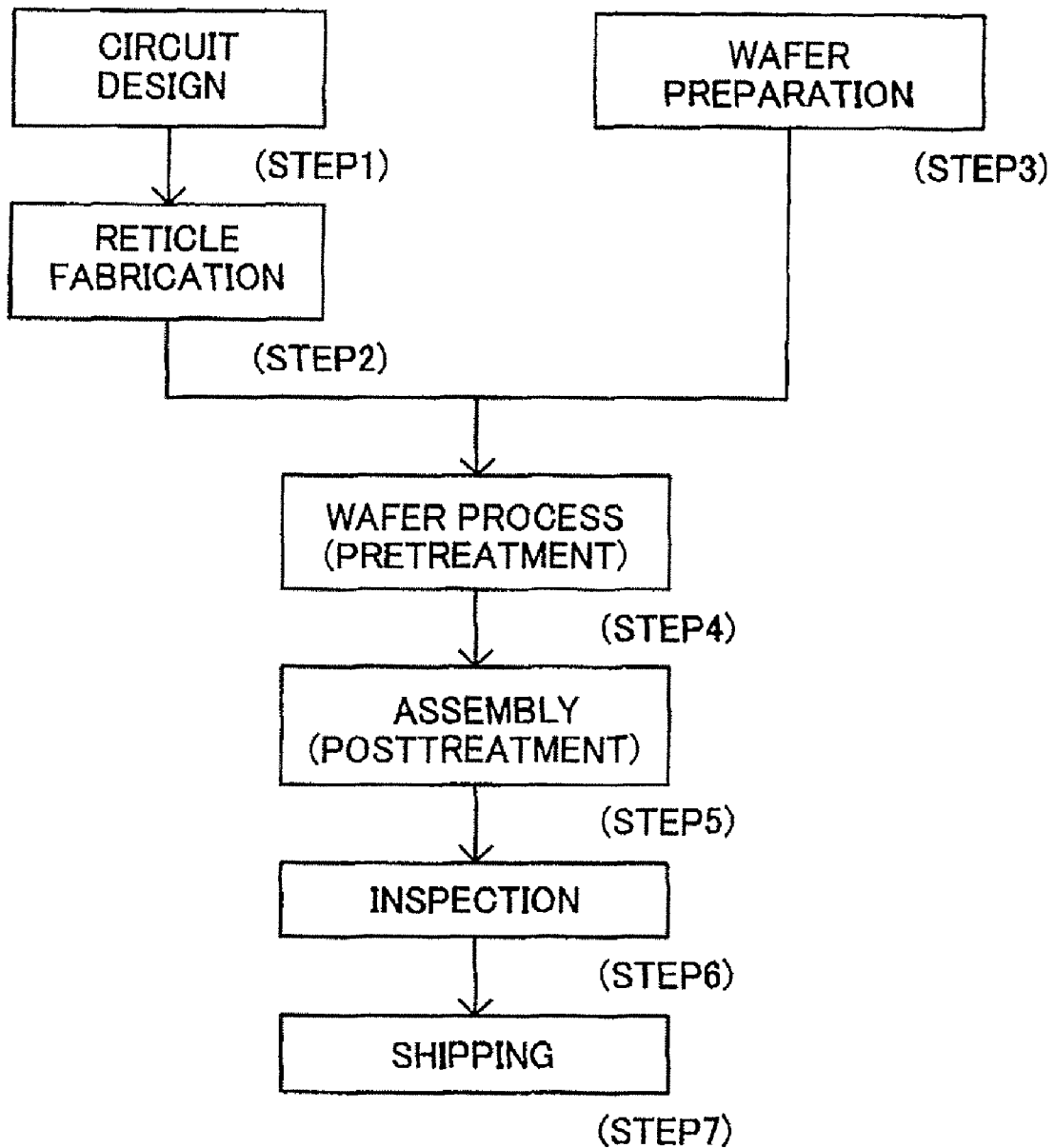
FIG. 16 is a flowchart for explaining manufacturing of a device such as a semiconductor chip, e.g., an IC and an LSI, an LCD, and a CCD.
Figure 17:
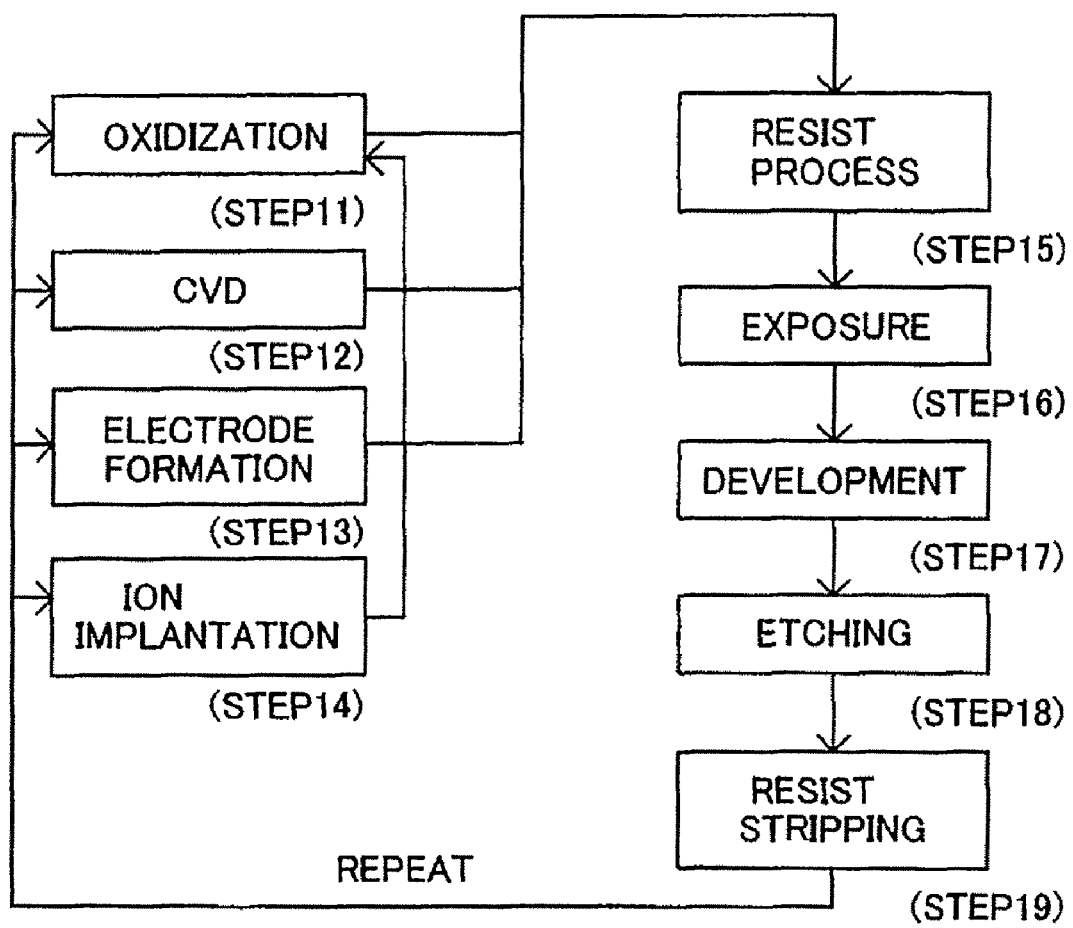
FIG. 17 is a flowchart of a step 4 shown in FIG. 16.

Referring now to FIGS. 16 and 17, a description will be given of an embodiment of a device manufacturing method using the above exposure apparatus 1. FIG. 16 is a flowchart for explaining how to manufacture semiconductor devices, such as ICs and LSIs, liquid crystal panels, and CCDs. This embodiment uses manufacture of a semiconductor chip. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pretreatment, forms the actual circuitry on the wafer through lithography using the reticle and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests on the semiconductor device made in Step 5, such as a validity test and a durability test. Through these steps, a semiconductor device is finished and shipped (Step 7).

FIG. 17 is a detailed flowchart of the wafer process in Step 4. Step 11 (oxidation) oxidizes the wafer's surface. Step 12 (CVD) forms an insulating layer on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus 100 to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated to form multi-layer circuit patterns on the wafer. The device manufacturing method of this embodiment may manufacture higher quality devices than ever. Thus, the device fabrication method using the exposure apparatus 1, and resultant devices constitute one aspect of the present invention.

Further, the present invention is not limited to these preferred embodiments, and various variations and modifications may be made without departing from the scope of the present invention. For example, the inventive measurement method is applicable to the wavefront-aberration measurement methods disclosed in U.S. Pat. Nos. 5,828,455 and 5,978,085. The inventive measurement method does not depend upon a type of a target optical system, and can measure an optical characteristic (such as a wavefront aberration) of various types of optical systems. For example, this method can measure optical characteristics (such as a wavefront aberration) of a dioptric optical system that includes only lenses, a catadioptric optical system that includes a lens and a mirror, and a catoptric optical system that includes only mirrors.

This application claims a foreign priority based on Japanese Patent Application No. 2005-246951, filed on Aug. 29, 2005, and which is hereby incorporated by reference herein.

What is claimed is:

1. A measurement apparatus for measuring an optical characteristic of a target optical system, said measurement apparatus comprising:
   a patterned member that has a plurality of patterns that reduce diffracted lights other than a predetermined order; and
   a pinhole member that has a plurality of pinholes,
   wherein the patterned member and the pinhole member are formed on front and back surfaces of a same substrate,
   wherein a center position of a first pattern among the plurality of patterns is shifted from a center position of a corresponding pinhole that is formed in the pinhole member and that faces the first pattern, and a center position of a second pattern among the plurality of patterns is shifted from a center position of a corresponding pinhole that is formed in the pinhole member and that faces the second pattern, and
   wherein a shift amount between the center position of the second pattern and the center position of the corresponding pinhole facing the second pattern is different from a shift amount between the center position of the first pattern and the center position of the corresponding pinhole facing the second pattern.

2. A measuring method for measuring an aberration of a projection optical system, said measuring method comprising the steps of:

illuminating a test reticle which has a plurality of first and second pinholes and a plurality of patterns, the plurality of first and second pinholes and the plurality of patterns being formed on front and back surfaces of a same substrate, the plurality of patterns including a plurality of first and second grating patterns, a center position of the first grating pattern being shifted from a center position of the first pinhole, a center position of the second grating pattern being shifted from a center position of the second pinhole, a shift amount between the center position of the second grating pattern and the center position of the second pinhole being different from a shift amount between the center position of the first grating pattern and the center position of the first pinhole;

projecting images of the plurality patterns in the test reticle by the projection optical system;

detecting positions of the images projected by said projecting step; and measuring the aberration of the projection optical system based on the positions detected by said detecting step.

3. A measuring method according to claim 2, wherein said measuring step measures high order terms past a thirty-sixth term in a Zernike polynomial in an aberration component of a wavelength of the projection optical system based on the positions of the images of the plurality of first and second grating patterns detected by said detecting step.

* * * * *